(12) United States Patent
Profatilova et al.

(10) Patent No.: US 12,266,768 B2
(45) Date of Patent: Apr. 1, 2025

(54) ELECTROCHEMICAL CELL FOR TESTING A SOLID-STATE BATTERY WITH SIMULTANEOUS MEASUREMENT OF THE GASES GENERATED

(71) Applicant: COMMISSARIAT A L'ENERGIE ATOMIQUE ET AUX ENERGIES ALTERNATIVES, Paris (FR)

(72) Inventors: Irina Profatilova, Grenoble (FR); Frédéric Gaillard, Grenoble (FR); Vasily Tarnopolskiy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 609 days.

(21) Appl. No.: 17/537,321

(22) Filed: Nov. 29, 2021

(65) Prior Publication Data

US 2022/0173443 A1  Jun. 2, 2022

(30) Foreign Application Priority Data

Nov. 30, 2020  (FR) ........................ 2012426

(51) Int. Cl.
*H01M 10/42* (2006.01)
*G01R 31/364* (2019.01)
*H01M 10/48* (2006.01)

(52) U.S. Cl.
CPC ...... *H01M 10/4285* (2013.01); *G01R 31/364* (2019.01); *H01M 10/486* (2013.01)

(58) Field of Classification Search
CPC ............ H01M 10/4285; H01M 10/486; G01R 31/364
See application file for complete search history.

(56) References Cited

U.S. PATENT DOCUMENTS

2021/0025771 A1* 1/2021 Park ..................... H02J 7/0048

FOREIGN PATENT DOCUMENTS

EP       3300159 A1 *  3/2018  ............ H01M 10/42

* cited by examiner

*Primary Examiner* — Karie O'Neill Apicella
(74) *Attorney, Agent, or Firm* — BakerHostetler

(57) ABSTRACT

An electrochemical cell for testing a battery, wherein the electrochemical cell includes two electrodes, preferentially made of vitreous carbon, intended to be in electrical contact with the battery to be tested.

9 Claims, 5 Drawing Sheets

ELECTROCHEMICAL CELL FOR TESTING A SOLID-STATE BATTERY WITH SIMULTANEOUS MEASUREMENT OF THE GASES GENERATED

CROSS-REFERENCE TO RELATED APPLICATIONS

This application claims priority to foreign French patent application No. FR 2012426, filed on Nov. 30, 2020, the disclosure of which is incorporated by reference in its entirety.

FIELD OF THE INVENTION

The invention lies in the technical field of testing batteries, and more specifically lithium-ion batteries with solid or polymer electrolytes. The invention relates to an electrochemical cell for testing a battery at constant pressure and at high temperatures with simultaneous measurement of the gases generated during a cycle.

BACKGROUND

Given the rapid and enormous growth of the market for electric vehicle batteries in recent years, there is great interest in solid-state batteries because of their potentially enhanced safety properties.

The production of gas is one of the events that has a direct impact on the safety of the lithium-ion batteries. However, the research and development of entirely solid battery materials are ongoing and research regarding their gas generation properties is necessary in each case.

The generation of gas during an electrochemical cycle linked with the electrochemical reactions is problematical. The gases generated can damage the electrical contacts of the battery, increase the pressure in the battery, then result in the leakage of toxic gases or explosion.

The gases $H_2S$, $SO_2$, $O_2$ are known to evolve in the Li-ion batteries containing layered oxide cathodes, solid-state electrolytes based on sulfides and LLZO (abbreviation for Lithium Lanthanum Zirconate Garnet). This phenomenon is of great interest for understanding the pathways for degradation of the batteries and the safety risks. Consequently, there is great scientific and practical interest in observing these gases in operando mode while a real battery with solid electrolytes is in operation.

Currently, no commercial cell is available to be able to perform multipurpose electrochemical tests of solid-state batteries coupled with operational measurements of the gases released.

There is a need for an electrochemical cell in which it is possible to perform an electrochemical cycle representative of a solid-state battery. Furthermore, such a cell needs to have chemical compatibility with the products of cell degradation in operando mode. In fact, it is known that certain gases can be adsorbed on most of the metal surfaces. Furthermore, gases such as $H_2S$ and $SO_2$ are corrosive when there are traces of moisture present. Consequently, in order not to lose by adsorption and underestimate the gases formed inside the cell and to maintain a good electrical contact, a protection of the surfaces is necessary while keeping in mind the electronic conductivity of the electrical contacts.

SUMMARY OF THE INVENTION

The invention aims to mitigate all or some of the problems cited above by proposing a novel electrochemical cell design for testing a battery at constant pressure and at high temperatures with simultaneous measurement of the gases generated during a cycle. The electrochemical cell proposed makes it possible to perform an electrochemical cycle representative of a solid-state battery while guaranteeing chemical compatibility with the products of cell degradation in operando mode.

The solution of the invention proposes an electrochemical cell with electrical connections that are resistant to the aggressive atmosphere due to the gases generated and that also form both an access to the gases generated for the measurement thereof and a gas-tight environment for the other elements of the cell.

To this end, the subject of the invention is an electrochemical cell for testing a battery, comprising two electrodes, preferentially made of vitreous carbon, intended to be in electrical contact with the battery to be tested.

In one embodiment, the electrochemical cell according to the invention comprises:
 a. a test cell made of non-conductive ceramic or of polyetheretherketone, preferentially of polyetheretherketone (PEEK), comprising:
    i. a cavity intended to receive the battery to be tested, the battery being intended to be subjected to an electrochemical cycle;
    ii. an outlet orifice for gas generated during the electrochemical cycle, the outlet orifice being fluidically connected with the cavity and of a section substantially at right angles to a first axis;
 b. a device for applying a temperature and a pressure to the battery, comprising the two electrodes, the device being tight to the gases generated by the battery during the electrochemical cycle.

In another embodiment, the test cell comprises an inlet orifice, situated opposite the outlet orifice with respect to the cavity along the first axis, for a carrier gas fluidically connected with the cavity.

Advantageously, the electrochemical cell further comprises a collector intended to recover, at the gas outlet orifice, the gases originating from the cavity during the electrochemical cycle.

In another embodiment, the test cell comprises a through opening extending on a second axis, secant with the first axis, preferentially at right angles, including the cavity, and the device comprises a bottom metal part and a top metal part, each comprising a protuberance extending on the second axis in the through opening and of a form complementing the through opening, each protuberance being terminated by one of the two electrodes, preferentially fixed to said protuberance by a conductive glue; the bottom part and the top part being movable in translation on the second axis relative to one another, so as to apply the pressure to the battery.

Advantageously, the application device comprises a heating press comprising a metal top plate and a metal bottom plate that are movable in translation with respect to one another on the second axis, the top plate being disposed above the top part, the bottom plate being disposed below the bottom part, so as to apply the temperature to the battery.

Advantageously, the application device comprises an element having a degree of freedom in translation on a second axis secant with the first axis, preferentially at right angles.

Advantageously, the test cell comprises a first threaded hollow screw positioned in the carrier gas inlet orifice, and intended to link the cavity to a carrier gas feed device, the first threaded hollow screw being preferentially made of PEEK, and more preferentially covered with PTFE.

Advantageously, the test cell comprises a second threaded hollow screw positioned in the gas outlet orifice and linking the cavity to the collector, the second threaded hollow screw being preferentially made of PEEK, and more preferentially covered with PTFE.

The invention relates also to a method for testing a battery in an electrochemical cell, comprising the following steps:
a. supplying a battery to be tested;
b. making electrical contact with the battery to be tested by two electrodes, preferentially made of vitreous carbon, of the electrochemical cell;
c. subjecting the battery to an electrochemical cycle.

Advantageously, the step of subjecting the battery to an electrochemical cycle simultaneously comprises a step of applying a pressure and a temperature to the battery and a step of maintaining the tightness of the electrical contact to the gases generated by the battery during the electrochemical cycle.

BRIEF DESCRIPTION OF THE DRAWINGS

The invention will be better understood and other advantages will emerge on reading the detailed description of an embodiment given by way of example, the description being illustrated by the attached drawing in which.

In these figures, for clarity, the scales are not observed. Moreover, the same elements will bear the same references in the different figures.

DETAILED DESCRIPTION

Figure 1:
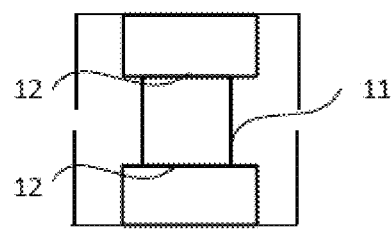
FIG. 1 schematically represents the making of electrical contact between a battery to be tested and an electrochemical cell according to the invention.

FIG. 1 schematically represents the making of electrical contact between a battery to be tested 11 and an electrochemical cell 10 according to the invention. The electrochemical cell 10 is intended to test a battery 11. According to the invention, the electrochemical cell 10 comprises two electrodes 12, preferentially made of vitreous carbon, intended to be in electrical contact with the battery 11 to be tested. The electrodes 12 can, alternatively, be made of tungsten carbide, nickel, or platinum. The two electrodes 12 allow electrical contact to be made on either side of the cell 10 and therefore of the battery 11. They are resistant to the polluted and aggressive atmosphere prevailing in the electrochemical cell during an electrochemical cycle during which different gases are generated. The two electrodes 12 make it possible to ensure the making of contact despite these gases which damage the standard electrical contacts.

Figure 2:
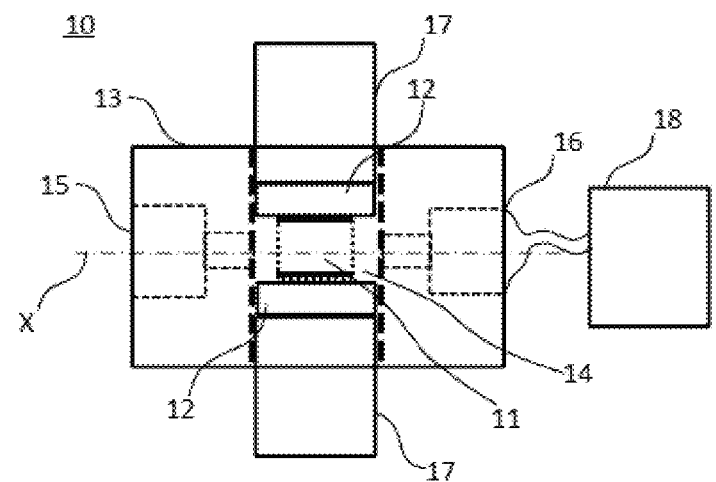
FIG. 2 schematically represents an embodiment of an electrochemical cell according to the invention.

FIG. 2 schematically represents an embodiment of an electrochemical cell 10 according to the invention. The electrochemical cell 10 comprises a test cell 13 made of non-conductive ceramic, for example of alumina $Al_2O_3$ or of polyetheretherketone (PEEK), and preferentially made of PEEK, comprising a cavity 14 intended to receive the battery 11 to be tested, the battery 11 being intended to be subjected to an electrochemical cycle. The test cell 13 comprises an outlet orifice 16 for gas generated during the electrochemical cycle. The outlet orifice 16 is fluidically connected with the cavity 14 and is of a section substantially at right angles to a first axis X. Finally, the electrochemical cell 10 comprises a device 17 for applying a temperature and a pressure to the battery 11. This device 17 comprises the two electrodes 12, the device 17 being tight to the gases generated by the battery 11 during the electrochemical cycle. In this embodiment, the electrochemical cell is configured to operate without carrier gas. The test is then carried out in a vacuum or at a certain pressure. The gas generated during the electrochemical cycle leaves through the outlet orifice 16.

In another embodiment (represented in FIG. 2), the test cell 13 comprises an inlet orifice 15, situated opposite the outlet orifice 16 with respect to the cavity 14 along the first axis X, for a carrier gas fluidically connected with the cavity 14.

By virtue of the test cell and the device for applying a temperature and a pressure, the electrochemical cell has a capacity to perform tests of solid-state batteries under adjustable constant pressure and at high temperature, typically of the order of 20 to 140° C. If the operating temperature of the battery is different, it is however possible to adapt this temperature as a function of the materials used. The constant pressure is of the order of a tonne, but if the materials used are not too hard, this pressure can be lower, of the order of 100 kg.

The thermoplastic PEEK (polyetheretherketone) is generally considered to be one of the most efficient in the world. PEEK offers exceptional performance levels over a vast range of temperatures and extreme conditions. PEEK combines unique thermal properties with mechanical properties and chemical resistance. This material can withstand a constant working temperature of 250° C. and has excellent long term chemical resistance. Furthermore, it exhibits excellent chemical and mechanical resistance, with a guarantee of rigidity and hardness at high temperatures.

The electrochemical cell 10 further comprises a collector 18 intended to recover, at the gas outlet orifice 16, the gases originating from the cavity 14 during the electrochemical cycle. The gases recovered in the collector 18 can then be analysed. Located in the collector 18 are the carrier gas introduced into the cell and the generated gases linked with the electrochemical reactions that are wanted to be identified and quantified. It is then possible to measure the gassing of the battery under test. This cell also makes it possible to perform the cycling and the gas analysis without carrier gas, including in a vacuum.

Figure 3:
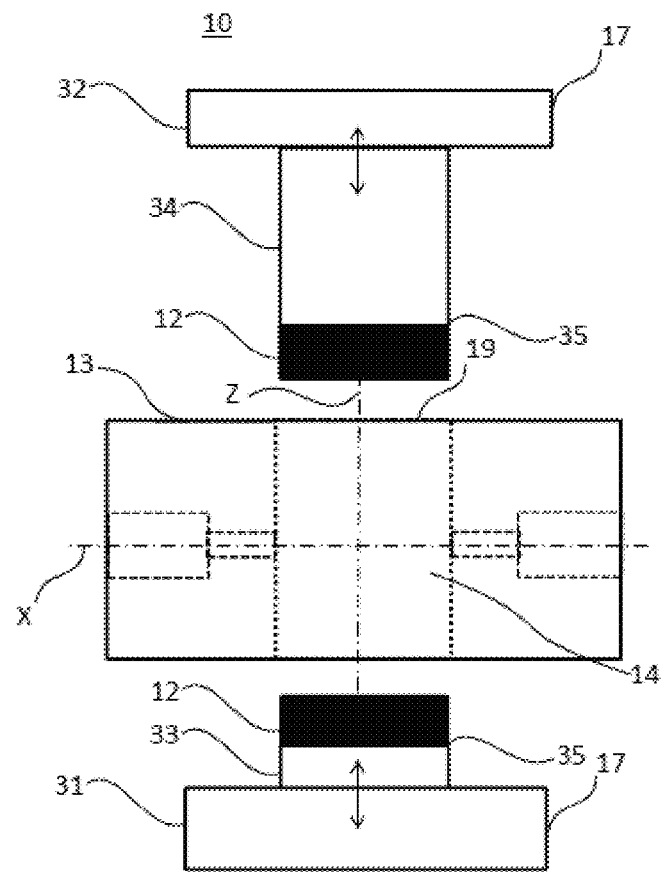
FIG. 3 schematically represents a device for applying a pressure to the battery of the electrochemical cell according to the invention.

FIG. 3 schematically represents a device 17 for applying a pressure to the battery of the electrochemical cell according to the invention. In this embodiment, the test cell 13 comprises a through opening 19 extending on a second axis Z, secant with the first axis X, preferentially at right angles, including the cavity 14. Also, the device 17 comprises a bottom metal part 31 and a top metal part 32, each comprising a protuberance 33, 34 extending on the second axis Z in the through opening 19 and of a form complementing the through opening 19, each protuberance 33, 34 being terminated by one of the two electrodes 12, preferentially fixed to said protuberance 33, 34 by a conductive glue 35. The bottom part 31 and the top part 32 are movable in translation on the second axis Z relative to one another, so as to apply the pressure to the battery 11. In other words, the protuberances 33, 34 press on either side of the battery 11 to ensure the mechanical contact for the purpose of exerting the predefined pressure for the test, while ensuring that electrical contact is made through the two electrodes which are positioned at the end of the protuberances. It can be noted in FIG. 3 that each protuberance is movable on the second axis Z. However, the invention applies also to the case where one of the protuberances, for example the bottom protuberance 33, is fixed and in position in the test cell, and only the other protuberance, for example the top protuberance 34, is movable on the second axis.

The metal parts 31, 32 can be made of any metal which withstands pressure. Those that can be cited by way of example include tungsten carbide or stainless steel.

Advantageously, the inner surface of the opening 19 is smooth to facilitate the movement of the protuberance in the opening and to minimize the adsorption of the gases.

Figure 4:
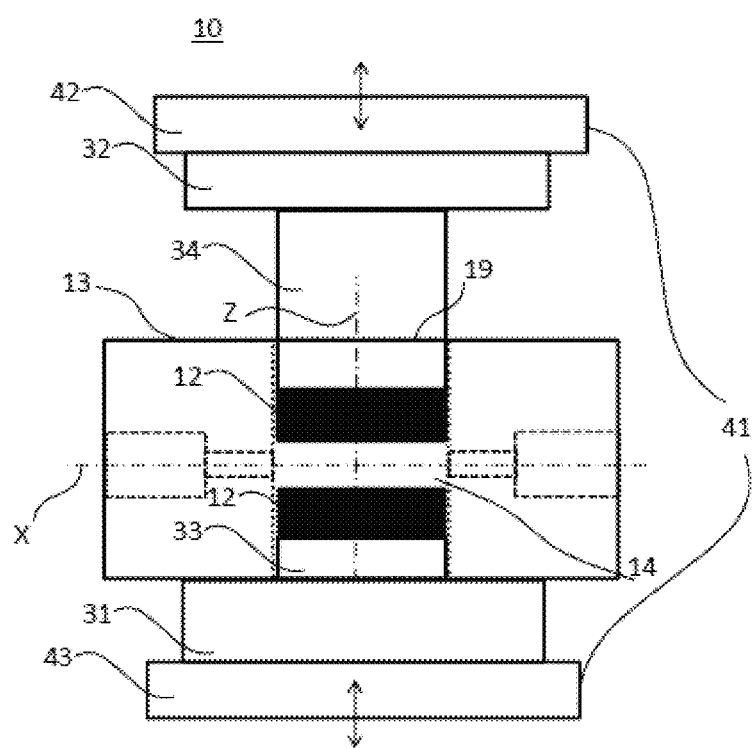
FIG. 4 schematically represents a device for applying a temperature to the battery of the electrochemical cell according to the invention.

FIG. 4 schematically represents a device 17 for applying a temperature to the battery of the electrochemical cell according to the invention. In this embodiment, the device 17 comprises a heating press 41 comprising a metal top plate 42 and a metal bottom plate 43 that are movable in translation with respect to one another on the second axis Z, the top plate 42 being disposed above the top part 32, the bottom plate 43 being disposed below the bottom part 31, so as to apply the temperature to the battery 11. By heating its plates 42, 43, the heating press 41 ensures the raising of the temperature of the metal parts 32, 31 to apply the predefined temperature range for the electrochemical cycle to which the battery to be tested is to be subjected. By applying a pressure on the metal parts 32, 31, the heating press 41 also ensures the application of the predefined pressure for the electrochemical cycle to which the battery to be tested is to be subjected.

It can be noted that the heating press 41 is a preferred embodiment for the application of the pressure and of the temperature to the battery. However, the invention applies with other means for heating the parts 31, 32, for example using an electrical resistor or any other suitable heating means known to a person skilled in the art.

The assembly formed by the test cell and the device for applying pressure and temperature makes it possible to obtain a gas-tight environment in the very construction of the cell, while applying the desired pressure and temperatures. On the one hand, the battery to be tested is subjected to an electrochemical cycle at the right pressure and at the right temperatures. On the other hand, the electrochemical cell according to the invention remains tight to the aggressive gases generated during the cycle, while making it possible to guarantee the making of electrical contact by the electrodes 12 which do not deteriorate. Furthermore, the electrochemical cell according to the invention makes it possible to capture the gases generated during the cycle for a subsequent analysis.

Figure 5:
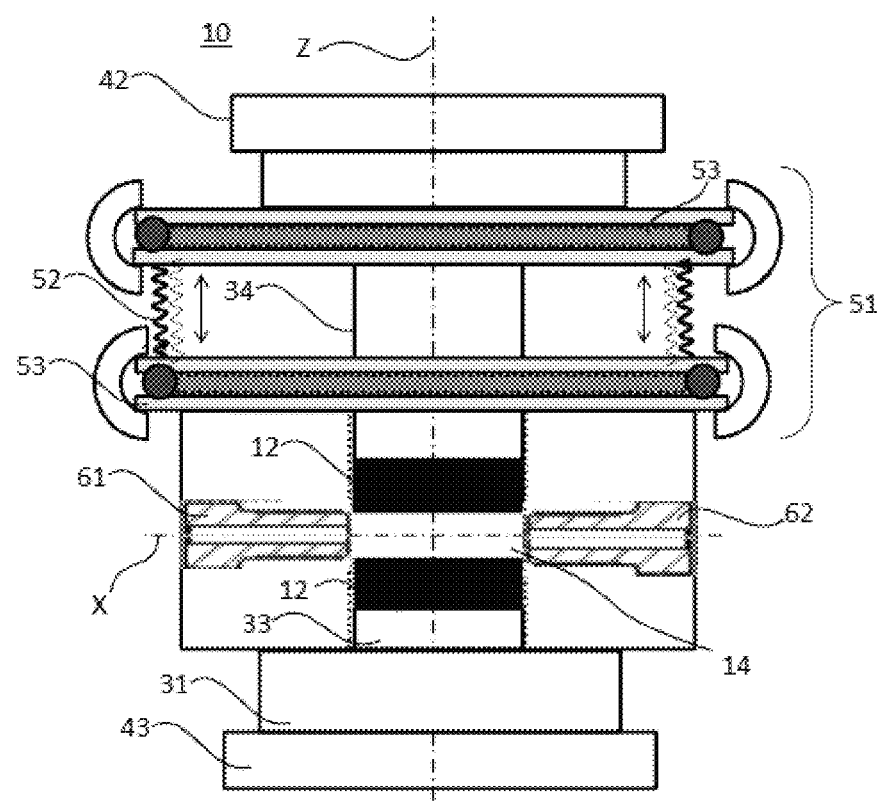
FIG. 5 schematically represents another embodiment of the electrochemical cell according to the invention.

FIG. 5 schematically represents another embodiment of the electrochemical cell according to the invention. In this embodiment, the device 17 comprises an element 51 having a degree of freedom in translation on a second axis Z secant with the first axis X, preferentially at right angles. The element 51 makes it possible to ensure the mounting tightness during the cycling, including in a vacuum and when hot. The element 51 can be a bellows, a sliding seal, an O-ring seal. The result thereof is a design which makes it possible to remain air-tight with a piston moving freely during the long-term electrochemical tests (generally with a duration of 1 to 30 days): a special design of a measurement cell comprising a suction pipe and collars.

In FIG. 5, the compensation element 51 is a bellows 52. It is positioned between two attachments 53 in contact with the test cell on the one hand and the top part 32 on the other hand. The attachments 53 can be made of stainless steel or of tungsten carbide. The seals in 51 can be made of polymer. This is an elastomer which exhibits a very good chemical resistance to the other aggressive fluids.

The element 51 can contract and extend to compensate for the expansion of the materials of the cell. Furthermore, it makes it possible to adjust the distance between the two electrodes 12 at the time of assembly of the cell.

Not represented in the figures, but accessible to a person skilled in the art, the electrochemical cell comprises a seal around the protuberance 33 at the base of the test cell. This seal can for example be made of fluorocarbon rubber (also known as Viton®).

Advantageously, the test cell 13 comprises a first threaded hollow screw 61 positioned in the carrier gas inlet orifice 15, and intended to link the cavity to a carrier gas feed device, and a second threaded hollow screw 62 positioned in the gas outlet orifice 16 and linking the cavity to the collector. The hollow screws allow the gaseous flow of the carrier gas to the cavity of the test cell and of the carrier gas with the gases generated by the electrochemical reactions from the cavity to the collector. They ensure the mechanical connection with the carrier gas feed device and with the collector. Preferentially, the first and/or the second threaded hollow screws 61, 62 are made of PEEK, or even, preferentially, covered with PTFE to ensure the seal function. Thus, the hollow screws are chemically and mechanically resistant, with a guaranteed withstand strength even at high temperatures.

The electrochemical cell according to the invention therefore makes it possible to maintain a good electrical contact, by virtue of the electrodes, between the protuberances which act as pistons in the opening of the test cell and the solid-state battery in all possible test conditions. The electrical contacts made by the chemically inert electrodes ensure the electrical conductivity within the cell. Current collectors made of steel or nickel can be placed on the battery to be tested.

By virtue of the design of the electrochemical cell according to the invention, the chemical protection of the surfaces against the corrosive gases is ensured. The metal electrical contacts are protected by conductive and inert vitreous carbon, tungsten carbide, nickel, gold or platinum (depending on the electrodes 12 used) on the electrodes. The non-conductive metal surfaces are advantageously protected by passivation solutions. The inner walls of the test cell and the gas-conducting channels are made of PEEK polymer.

The electrochemical cell according to the invention thus makes it possible to avoid the short-circuits by combining metal and plastic parts.

The device 17 for applying pressure and temperature makes it possible to control both the temperature of the battery and the pressure applied to the battery. This pressure needs to be constant. The flexibility of the element 51 on the second axis makes it possible to absorb the height variations induced by the expansion of the materials subjected to high temperatures.

The electrochemical cell of the invention offers the capacity to perform an electrochemical cycle representative of a solid-state battery while being chemically compatible with the cell in mode operando with the cell degradation products. That is made possible by the provision of the electrical connections with the electrodes. As explained previously, the test cell offers the advantage of controlling the pressure and temperature applied to the test battery. The temperature can be set and/or checked by means of a thermocouple disposed in proximity to the battery to be tested. It can also be noted that the pressure is kept constant, but the value of the pressure applied can be set. During the measurements, the electrochemical cell remains air-tight: through its construction, no outside air penetrates into the cavity, even with expansion of the parts which is compensated by the element 51. Only the carrier gas can enter into the cavity. It re-emerges therefrom with the gases generated and all of these gases are collected at the outlet. Measurements without carrier gases, including in a vacuum, are also feasible. The electrochemical cell makes it possible to provide a continuous sampling of the corrosive gaseous degradation products derived from the electrochemical cycle.

Figure 6:
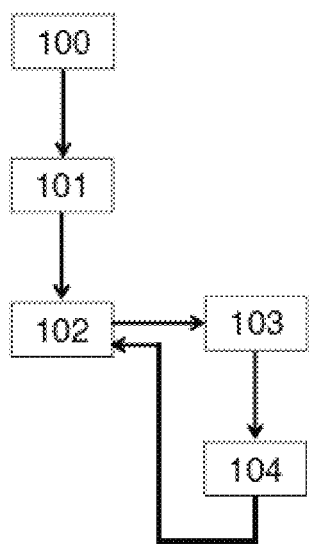
FIG. 6 represents a flow diagram illustrating the steps of a method for testing a battery in an electrochemical cell according to the invention.

FIG. 6 represents a flow diagram illustrating the steps of a method for testing a battery 11 in an electrochemical cell 10 according to the invention. The method for testing a battery 11 in an electrochemical cell 10 comprises the following steps:

a. supplying a battery 11 to be tested (step 100);
b. making electrical contact with the battery 11 to be tested (step 101) by two electrodes 12 of the electrochemical cell 10;
c. subjecting the battery 11 to an electrochemical cycle (step 102).

Advantageously, the step 102 of subjecting the battery to an electrochemical cycle simultaneously comprises a step 103 of applying a pressure and a temperature to the battery 11 and a step 104 of maintaining the tightness of the electrical contact to the gases generated by the battery 11 during the electrochemical cycle by virtue of the element 51 which has a degree of freedom as explained previously. The maintaining of the tightness of the electrical contact is made possible by the combination of the protuberances 33, 34 which bring the electrodes 12 into contact on the battery to be tested 11 and the application of pressure by the device 17.

It will appear more generally to the person skilled in the art that various modifications can be made to the embodiments described above, in light of the teaching which has just been disclosed to him or her. In the following claims, the terms used should not be interpreted as limiting the claims to the embodiments explained in the present description, but should be interpreted to include therein all the equivalents that the claims aim to cover through their formulation and the planning of which is accessible to the person skilled in the art based on his or her general knowledge.

The invention claimed is:

1. A cell for testing an electrochemical battery, wherein the cell comprises two electrodes, intended to be in electrical contact with the electrochemical battery to be tested, the cell comprising:
   a. a test cell made of non-conductive ceramic, comprising:
      i. a cavity intended to receive the electrochemical battery to be tested, the electrochemical battery being intended to be subjected to an electrochemical cycle;
      ii. an outlet orifice for gas generated during the electrochemical cycle, the outlet orifice being fluidically connected with the cavity and of a section substantially at right angles to a first axis;
      iii. a through opening extending on a second axis (Z), secant with the first axis, including the cavity
   b. an application device for applying a temperature and a pressure to the electrochemical battery, comprising the two electrodes, the device being tight to the gases generated by the electrochemical battery during the electrochemical cycle, the electrodes being made of a corrosion-resistant material, the device further comprising a bottom metal part and a top metal part, each comprising a protuberance extending on the second axis (Z) in the through opening and of a form complementing the through opening, each protuberance being terminated by one of the two electrodes, the bottom part and the top part being movable in translation on the second axis (Z) relative to one another, so as to apply the pressure to the electrochemical battery.

2. The cell according to claim 1, wherein the test cell comprises an inlet orifice, situated opposite the outlet orifice with respect to the cavity along the first axis, for a carrier gas fluidically connected with the cavity.

3. The cell according to claim 1, further comprising a collector intended to recover, at the gas outlet orifice, the gases originating from the cavity during the electrochemical cycle.

4. The cell according to claim 1, wherein the application device comprises a heating press comprising a metal top plate and a metal bottom plate that are movable in translation with respect to one another on the second axis (Z), the top plate being disposed above the top part, the bottom plate being disposed below the bottom part, so as to apply the temperature to the electrochemical battery.

5. The cell according to claim 1, wherein the application device comprises an element having a degree of freedom in translation on a second axis (Z) secant with the first axis at right angles.

6. The cell according to claim 2, wherein the test cell comprises a first threaded hollow screw positioned in the carrier gas inlet orifice, and intended to link the cavity to a carrier gas feed device, the first threaded hollow screw being made of polyetheretherketone and covered with PTFE.

7. The cell according to claim 3, wherein the test cell comprises a second threaded hollow screw positioned in the gas outlet orifice and linking the cavity to the collector, the second threaded hollow screw being made of polyetheretherketone, and covered with PTFE.

8. A method for testing the electrochemical battery in the cell according to claim 1, comprising the following steps:
   a. supplying the electrochemical battery to be tested;
   b. making electrical contact with the electrochemical battery to be tested by two electrodes of the cell;
   c. subjecting the electrochemical battery to an electrochemical cycle.

9. The method for testing the electrochemical battery in the cell according to claim 8, wherein the step of subjecting the electrochemical battery to an electrochemical cycle simultaneously comprises a step of applying a pressure and a temperature to the battery and a step of maintaining the tightness of the electrical contact to the gases generated by the electrochemical battery during the electrochemical cycle.

* * * * *